United States Patent [19]

Williams et al.

[11] Patent Number: 4,514,784

[45] Date of Patent: Apr. 30, 1985

[54] INTERCONNECTED MULTIPLE CIRCUIT MODULE

[75] Inventors: John T. Williams; Melvin C. August, both of Chippewa Falls, Wis.

[73] Assignee: Cray Research, Inc., Minneapolis, Minn.

[21] Appl. No.: 487,515

[22] Filed: Apr. 22, 1983

[51] Int. Cl.[3] ........ H05K 7/20

[52] U.S. Cl. ........ 361/386; 361/396; 361/413; 339/17 M; 339/154 A

[58] Field of Search ........ 339/17 LM, 17 M, 112 R, 339/214 R, 17 C, 248 R, 32 R, 32 M, 33, 65, 66 M, 154 A; 361/385-388, 396, 412, 413

[56] References Cited

U.S. PATENT DOCUMENTS

| | | | |
|---|---|---|---|
| 2,694,799 | 11/1954 | Del Camp | 339/154 A |
| 2,969,521 | 1/1961 | Scoville | 339/214 R |
| 3,377,516 | 4/1968 | Ellett et al. | 361/396 |
| 3,489,952 | 1/1970 | Hinchey | 361/386 |
| 3,764,856 | 10/1973 | Martin | 361/412 X |

*Primary Examiner*—G. P. Tolin

*Attorney, Agent, or Firm*—Merchant, Gould, Smith, Edell, Welter & Schmidt

[57] ABSTRACT

The specification discloses an interconnected multiple circuit module (10) including a connector assembly (14) for interconnecting two circuit modules (12) each having at least one circuit board assembly (16). The connector assembly (14) includes pins (26) extending through the circuit board assemblies (16) and a free connector block (28) for receiving the pins in opposite ends. The pins (26), connector block (28) and contacts (40) within the block are preferably adapted to provide differential mechanical resistances on opposite ends of the block between the pins to facilitate controlled predictable electrical connection of the circuit modules (12).

5 Claims, 6 Drawing Figures

INTERCONNECTED MULTIPLE CIRCUIT MODULE

TECHNICAL FIELD

The present invention relates generally to electrical modules incorporating a plurality of circuit boards. More particularly, this invention involves a multiple circuit module interconnected by a connector assembly wherein arrays of male members are provided on opposing circuit boards and corresponding arrays of mating dual-entry female members are provided between the ends of an intermediate block to facilitate alignment and controlled connection or disconnection over circuit paths of minimal length.

BACKGROUND ART

Circuit boards are utilized in many types of electronic equipment and it is often necessary, particularly in complex equipment, to interconnect the circuit boards into a module, and to interconnect modules into multiple circuit modules. For example, high speed electronic digital computers of the type produced by Cray Research, the assignee hereof, utilize circuit modules consisting of circuit boards mounted in close proximity on opposite sides of cooling plates. Such circuit modules are arranged in banks and it is therefore desirable to interconnect adjacent modules in a manner which permits convenient disconnection for service and reconnection after service, and which also air permits reverse stacking for testing.

A variety of connectors have been developed heretofore for electrically interconnecting two or more circuit boards in order to form a circuit module, however, the connectors of the prior art have not been altogether satisfactory for one reason or another. For example, one common approach has been to provide mating connectors at the edges of the circuit boards, however, this results in long circuit paths which in turn decrease circuit speed. Another approach has been to mount the male and female portions on opposing adjacent surfaces of the circuit boards to be connected. This approach only permits pairs of circuit boards to be interconnected, and is not adapted for reverse connection or for interconnecting in a chain. Another approach has been to provide each circuit board with a transverse pin and socket connector so that the pin or male portion is located on the opposite side from the socket or female portion. This approach permits reversal and allows chains of circuit boards to be connected together, however, precise placement and alignment of the connectors is necessary for proper connection. Such connectors are susceptible to damage and are both difficult and time consuming to repair or replace if damaged. Connectors of this type are not especially tolerant to misalignment and can easily become damaged during attempted connection if misaligned even slightly. In addition, the connectors of the prior art have not been particularly adapted to minimize twisting effects during disconnection or to release in a predictable, controlled manner so as to minimize possible damage to the connector.

A need has thus developed for a new and improved interconnected multiple circuit module with a connector of rugged construction which minimizes twisting and misalignment and which also facilitates connection over the shortest circuit paths and stacking of multiple circuit boards in reverse arrangement for testing and the like.

SUMMARY OF THE INVENTION

The present invention comprises an interconnected multiple circuit module which overcomes the foregoing and other difficulties associated with the prior art. In accordance with the invention, there is provided a multiple circuit module incorporating a connector assembly which is particularly adapted for facilitating connection and disconnection of circuit boards such as those used within a high speed digital electronic computer or other electronic equipment. The modules include a plurality of connector assemblies, each of which includes a plurality of pins grouped in an array mounted in and extending through each circuit module, each of which includes at least one circuit board assembly. The ends of the pins project at uniform distances outward from opposite sides of the circuit module. The connector assembly further includes a block having a plurality of openings in opposite ends with contacts therebetween for receiving the pins on separate circuit board modules to form an interconnected multiple circuit module. The use of closely spaced arrays of pins facilitates alignment with the connector block and minimizes the twisting effects which can lead to misalignment and damage to the pins. Preferably, the contacts in the connector block are adapted to provide differential interfering engagement with the associated array of pins so that complete connection or disconnection of the modules will occur in a predictable, controlled manner.

BRIEF DESCRIPTION OF DRAWINGS

A better understanding of the invention can be had by reference to the following Detailed Description in conjunction with the accompanying Drawings, wherein.

DETAILED DESCRIPTION

Figure 1:
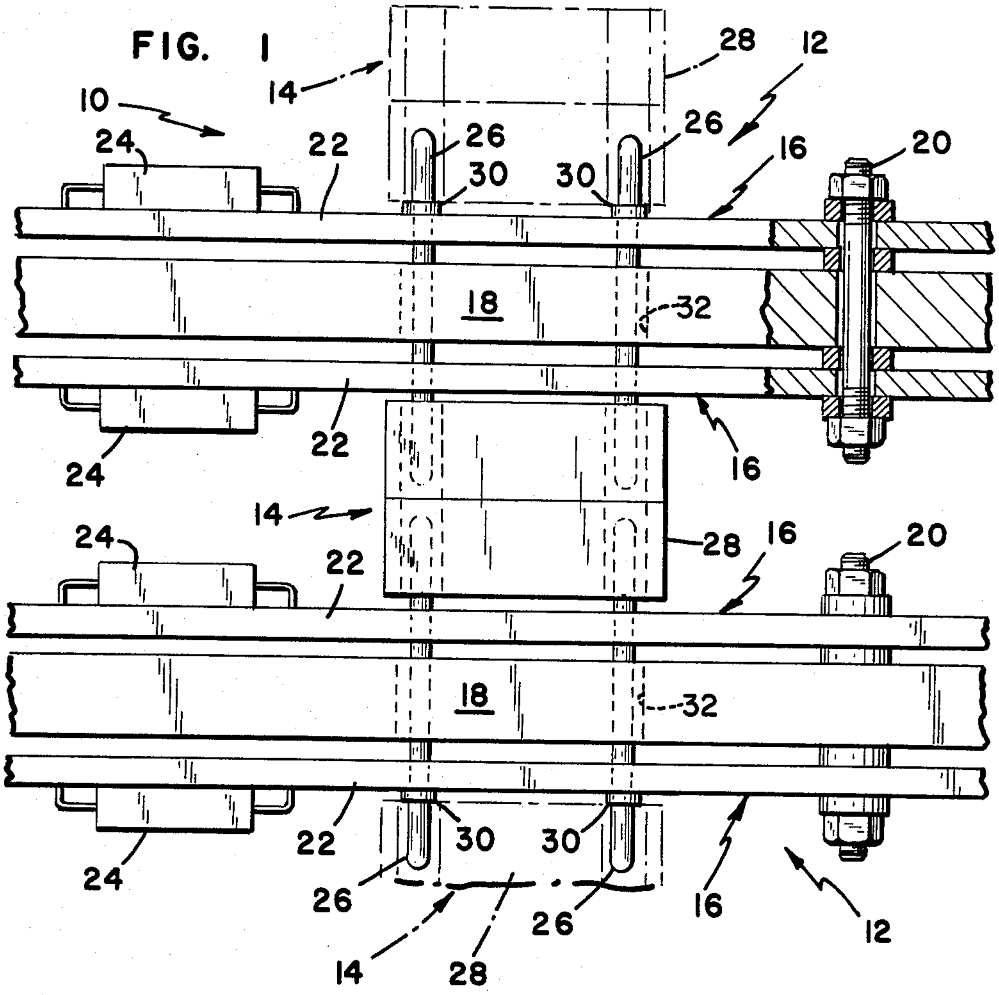
FIG. 1 is a partial side view showing the interconnected multiple circuit module and connector assembly of the invention.

Referring now to the drawings, wherein like reference numerals designate corresponding elements throughout the views, and particularly referring to FIG. 1, there is shown the interconnected multiple circuit module 10 of the invention. As illustrated, the multiple circuit module 10 includes a pair of generally horizontal circuit modules 12 connected together by means of several connector assemblies 14, only one of which has been shown in full. The interconnected multiple circuit module 10 as described and illustrated herein is particularly suited for use in high speed digital electronic computers, however, it will be understood that the invention can also be adapted for use in other applications where it is desirable to interconnect two or more circuit boards. As will be explained more fully hereinafter, the invention facilitates alignment and positive connection between the circuit boards over the shortest circuit paths while minimizing twisting and unpredictable, uncontrolled connection or disconnection which can lead to damage.

Each circuit module 12 comprises a pair of circuit board assemblies 16 disposed in predetermined minimal spaced apart relationship on opposite sides of a central cooling plate 18. The cooling plate 18, which is preferably formed of a suitable thermally conductive material such as copper, is engaged in edgewise contact between a pair of generally vertical refrigerated cooling bars (not shown) forming a portion of the computer chassis. Each circuit board assembly 16 is maintained in predetermined minimal spaced apart relationship with the cooling plate 18 by means of several spacer/connectors 20, only one of which has been shown for each module 12. Each circuit board assembly 16 includes a circuit board 22 with a plurality of electronic devices 24 mounted on the side of the circuit board away from the cooling bar 18. The circuit board 22 of each assembly 16 preferably includes several photo etched conductive layers defining circuit paths to which the electronic devices 24 are connected in accordance with conventional printed circuit board assembly techniques. Each circuit module 12 is thus constructed substantially similarly to that shown in U.S. Pat. No. 4,120,021 assigned to the assignee hereof, the disclosure of which is incorporated herein by reference.

Figure 2:
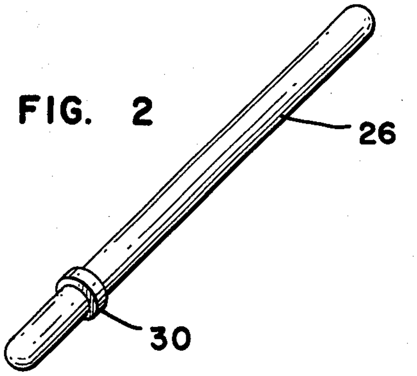
FIG. 2 is an enlarged perspective view of one of the pins in the connector assembly.

Referring now to FIG. 1 in conjunction with FIG. 2, the connector assembly 14 includes a plurality of pins 26, and a free connector block 28. A plurality of pins 26 are secured to each circuit module 12 and each circuit board assembly 16 thereof. In particular, the pins 26 are preferably grouped in relatively close spaced apart relationship to define an array of pins which extend substantially perpendicularly through each circuit module 12. A collar 30 is preferably provided a predetermined distance from one end of each pin to facilitate insertion and proper location of the pins from one side of the module 12. The pins 26 are preferably soldered in place in electrical contact with the desired conductive layers of the circuit boards 22. Clearance holes 32 are provided in the cooling plate 18 so that there is no electrical contact between the pins 26 and the cooling plate.

It will thus be appreciated that an array of relatively closely spaced, substantially perpendicular pins 26 are provided on both sides of each circuit module 12. Common pins 26 of sufficient length can be utilized, as illustrated, to interconnect the circuit board assemblies 16 within each circuit module 12, and it will be understood that the pins would be relatively shorter in the case of modules lacking a cooling plate 18 or including only one circuit board assembly. Each pin 26, for example, can be about 0.350 inch long by 0.020 inch in diameter, with a 0.028 inch diameter collar located 0.083 inch from one end. The ends of pins 26 are preferably rounded as shown to facilitate insertion in the connector block 28.

Figure 3:
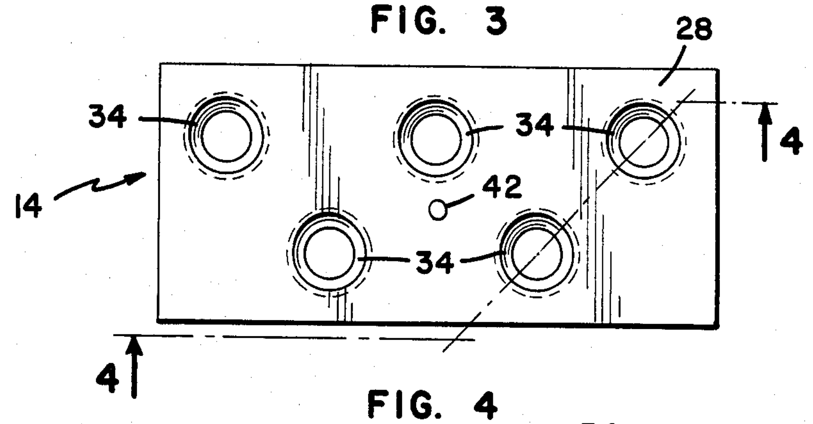
FIG. 3 is a top view of the connector block according to the first embodiment of the invention.
Figure 4:
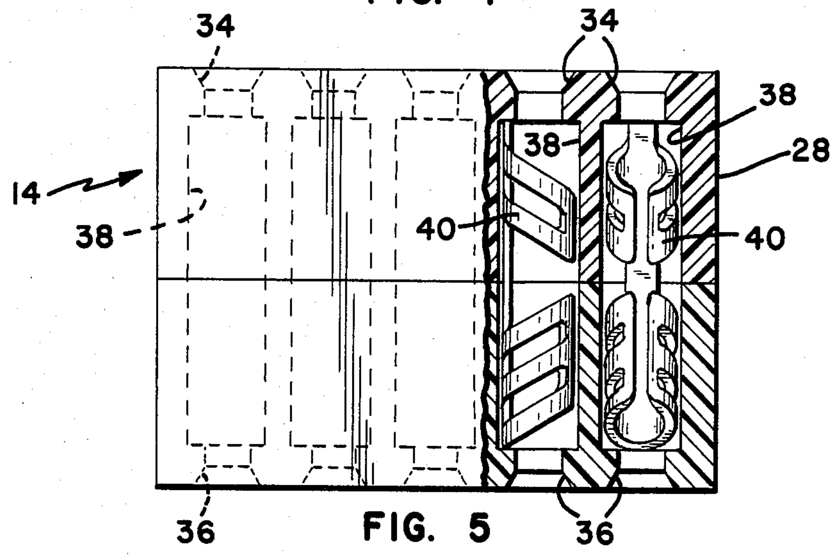
FIG. 4 is a side view, partially cut away, of the connector block shown in FIG. 2.

Referring now to FIG. 1 in conjunction with FIGS. 3 and 4, the connector block 28 comprises a block of suitable dielectric material with arrays of holes 34 and 36 on opposite ends thereof for receiving the pins 26. Each hole 34 and 36 is preferably countersunk to allow clearance for the collars 30 on the pins 26, or for fillets of solder between the pins and the circuit board assemblies 16. The connector block 28 is shown with five relatively closely spaced openings 34 and 36 on opposite ends of the block for receiving a like number of pins 26 in the same arrangement, however, it will be understood that any suitable number of openings and pins can be utilized. The connector block 28 can be formed of any suitable dielectric material, which is also preferably fire retardant. For example, the connector block 28 can be of split construction bonded by means of ultrasonic welding, and formed of fire retardant modified polycarbonate having a dielectric constant less than 3.5.

Each opposing pair of openings 34 and 36 is connected by a counterbore 38 having a dual-entry contact 40 therein which receives the pins 26, on adjacent circuit modules 12 and establishes electrical contact therebetween. Any suitable contacts can be utilized for contacts 40. For example, dual entry rib cage contacts of the type illustrated and available from Berg Electronics of New Cumberland, Pa., can be used.

In accordance with the preferred embodiment of the invention, the connector assembly 14 is adapted to provide differential degrees of mechanical resistance relative to the pins 26 received in opposite ends of the connector block 28 so as to facilitate predictable, controlled disconnection of the circuit modules 12. This can be accomplished by constructing the opposite ends of pins 26 with different external dimensions, and maintaining constant internal dimensions between the ends of contacts 40, or vice versa. This can also be accomplished by maintaining the external and internal diameters of the pins 26 and contacts 40, respectively, substantially equal, but adapting the ends of one to engage the other with different degrees or types of engagement. As illustrated, pins 26 are of substantially constant diameters at their ends, while the dual entry rib cage contacts 40 define two areas of contact at the upper end and three at the bottom end. Complete connection or disconnection of the top module 12 will thus precede that of the lower module 12. The connector assembly 14 is adapted to provide a maximum top resistance of about 75 grams and a maximum bottom resistance of about 150 grams, although a differential resistance of at least 25 grams would be adequate for predictable controllability. If desired, suitable indica or a contrasting mark 42 can be provided on the top end of the connector block 28.

Figure 5:
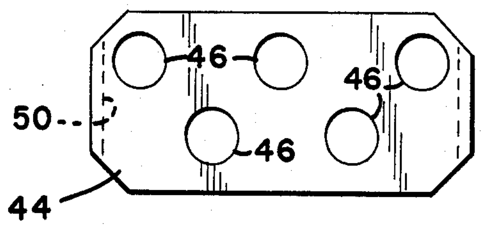
FIG. 5 is a top view of a connector block according to a second embodiment of the invention.
Figure 6:
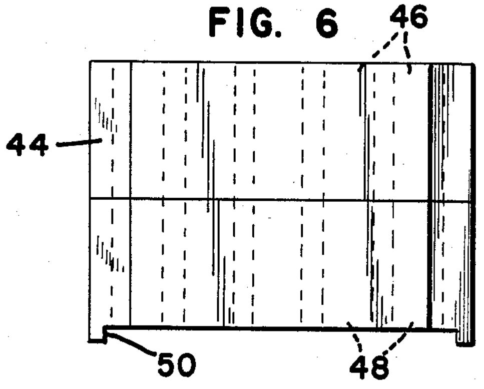
FIG. 6 is a side view of the connector block shown in FIG. 4.

Referring now to FIGS. 5 and 6, there is shown an alternate form of connector block 44 which can be used in the connector assembly 14 instead of connector block 28. The connector block 44 includes chamfered longitudinal corners and is therefore not rectangular in cross section as is block 28. Openings 46 and 48 are provided in opposite ends of the block 44, with contacts (not shown) similar to contacts 40 being located between the openings to effect electrical connection upon insertion of the pins 26 on opposing circuit modules. The primary differences between blocks 44 and 28 comprise the fact that openings 46 and 48 are not countersunk, and the fact that the openings 48 are arranged in a recess 50 at one end of the block 44 to provide clearance for solder fillets or the collars 30 on pins 26. In all other respects, block 44 functions the same as block 28 and can be substituted therefor.

From the foregoing, it will thus be apparent that the present invention comprises an interconnected multiple circuit module having numerous advantages over the prior art. One advantage involves the fact that only the male pins, which are the least expensive and most durable parts of the connector assembly, are secured to the circuit boards. In the case of modules having two or more circuit boards, the pins serve the dual purpose of interconnecting the circuit boards and facilitating connection of the module to another. The "live" parts, which are the female contacts, are located within a free connector block which is adapted to receive the pins in opposite ends in order to facilitate alignment and positive connection without binding over the shortest circuit paths between the modules. The connector assembly is preferably adapted to provide differential interfering engagement between the ends of the connector block and the pins on the associated module to facilitate predictable controlled connection and disconnection of multiple circuit boards. Other advantages will be evident to those skilled in the art.

Although particular embodiments of the invention have been illustrated in the accompanying Drawings and described in the foregoing Detailed Description, it will be understood that the invention is not limited to the embodiments disclosed, but is intended to embrace any alternatives, equivalents, modifications and rearrangements of elements falling within the scope of the invention as defined by the following claims.

I claim:

1. An interconnected multiple circuit module, comprising:
- a pair of circuit modules, each including at least one circuit board therein;
- an array of male pins mounted on each circuit module, each array including a plurality of pins located in a predetermined arrangement and extending substantially perpendicular to the associated circuit board such that opposite corresponding ends of the pins are positioned on opposite sides of the associated circuit module:
- a free connector block of dielectric material with opposite ends, each end including an array of openings therein receiving the pins on the associated circuit module; and
- dual-entry female contact means within said block releasably engaging pins inserted into the openings to effect electrical connection between said circuit modules, said contact means having a structure which provides differential mechanical connecting resistance with the pins of one module versus the pins of the other module to facilitate predictable controlled connection and disconnection of said circuit modules.

2. The interconnected circuit module assembly according to claim 1, wherein said contact means comprises dual entry contacts of the rib cage type.

3. The interconnected circuit module assembly of claim 1, wherein each circuit module includes a pair of circuit boards disposed in predetermined minimal spaced relationship on opposite sides of a cooling plate, with the associated pins interconnecting said circuit boards and being electrically insulating from the cooling plate.

4. An interconnected multiple circuit module assembly, comprising:
- a pair of circuit modules, each including a pair of circuit boards disposed in predetermined spaced relationship on opposite sides of a cooling bar;
- an array of pins mounted on each circuit module, each array including a plurality of pins located in a predetermined arrangement and extending substantially perpendicular to the circuit board such that opposite corresponding ends of the pins are positioned on opposite sides of the associated circuit module;
- a connector block of dielectric material with opposite ends, said end including an array of openings therein receiving the pins on the associated circuit module; and
- dual-entry contact means within said block releasably engaging pins inserted into the openings to effect electrical connection between said circuit modules, said contact means having a structure which provides differential mechanical connecting resistance between the pins received in opposite ends of said connector block to facilitate predictable controlled connection and disconnection of said circuit modules.

5. An interconnected multiple circuit module assembly, comprising:
- a pair of circuit modules, each including a pair of circuit boards secured in predetermined spaced relationship on opposite sides of a cooling plate of thermally conductive material;
- an array of pins mounted on each circuit module, said array including a plurality of pins located in a predetermined arrangement and extending substantially perpendicular through the circuit boards and cooling bar such that opposite corresponding ends of the pins project beyond opposite sides of the associated circuit module;
- said pins electrically interconnecting the circuit boards but being electrically isolated from the cooling plate of the associated circuit module;
- a collar located at a predetermined distance inward from an end of each pin to facilitate transverse location of said pins relative to the associated circuit module;
- a connector block of dielectric material with opposite ends disposed between said circuit modules, each end of said block including an array of openings therein receiving the ends of the pins on the adjacent circuit module; and
- dual-entry contact means within said block engaging opposing pins inserted into the openings to effect electrical connection between said circuit modules, said contact means having a structure which provides differential mechanical connecting resistance between the pins received in opposite ends of said connector block to facilitate predictable controlled connection and disconnection of said circuit modules.

* * * * *